United States Patent [19]
Nakamura

[11] Patent Number: 5,926,398
[45] Date of Patent: Jul. 20, 1999

[54] SEMICONDUCTOR DEVICE LAYOUT METHOD CAPABLE OF ARRANGING FUNCTIONAL CELLS WITH DATA SIGNAL LINES AND CONTROL SIGNAL LINES HAVING A PROPER LENGTH AND CONFIGURATION

[75] Inventor: Takeshi Nakamura, Tokyo, Japan

[73] Assignee: NEC Corporation, Tokyo, Japan

[21] Appl. No.: 08/813,937

[22] Filed: Mar. 3, 1997

[30] Foreign Application Priority Data

Mar. 5, 1996 [JP] Japan ..................................... 8-047431

[51] Int. Cl.⁶ ...................................... G06F 17/50
[52] U.S. Cl. ............................................ 364/491; 364/490
[58] Field of Search ..................... 364/488–491

[56] References Cited

U.S. PATENT DOCUMENTS

| | | | |
|---|---|---|---|
| 4,882,690 | 11/1989 | Shinsha et al. | 364/490 |
| 5,341,308 | 8/1994 | Mendel | 364/489 |
| 5,566,078 | 10/1996 | Ding et al. | 364/490 |
| 5,659,717 | 8/1997 | Tse et al. | 395/500 |
| 5,661,663 | 8/1997 | Scepanovic et al. | 364/490 |

FOREIGN PATENT DOCUMENTS 5-152439  6/1993  Japan .
8-87533   4/1996  Japan ............................... G06F 17/50

OTHER PUBLICATIONS

PTO 99–0248 (translation of Japanese Document No. 08–087533, published Apr. 2, 1996, filed Sep. 16, 1994, invented by Nakamura et al.).

PTO 99–0138 (translation of Japanese Document No. 05–152439, published Jun. 18, 1993, filed Nov. 27, 1991, invented by Hakoda et al.).

*Primary Examiner*—Kevin J. Teska
*Assistant Examiner*—Phallaka Kik
*Attorney, Agent, or Firm*—Young & Thompson

[57] ABSTRACT

A semiconductor device layout method arranges a given number of functional cells with regularity. In the layout method, a net list including circuit connection data necessary for the arrangement of the cells is read out, and then, the functional cells are divided into groups based on the net list and common data or control signals. Subsequently, an arranging order of the common data signals and the common control signals is determined, and then, the functional cells are rearranged per group based on the common data or control signals. Thereafter, a relative position list including relative positions of the rearranged functional cells is produced. Then, the functional cells are arranged based on read-out size data of the functional cells and the relative position list.

6 Claims, 8 Drawing Sheets

SEMICONDUCTOR DEVICE LAYOUT METHOD CAPABLE OF ARRANGING FUNCTIONAL CELLS WITH DATA SIGNAL LINES AND CONTROL SIGNAL LINES HAVING A PROPER LENGTH AND CONFIGURATION

BACKGROUND OF THE INVENTION

The present invention relates to a semiconductor device layout method and, in particular, to a layout method for arranging a given number of cells with regularity. Each of the cells includes one or more transistors and one or more passive elements which are wired and connected in a given manner so as to perform a logical operation, and is generally called a functional cell.

In the general data path layout, a plurality of functional cells are arranged with regularity and connected to the wiring in the form of data signal lines and control signal lines. For determining an arrangement of these functional cells, there have been available the following first to fourth layout methods, which will also be described later in further detail with reference to the drawings:

In the first layout method, a cell rank length limiting value is used for limiting a cell rank length, that is, the sum of widths of the functional cells included in one rank. The functional cells are grouped so as to be disposed within the cell rank length limiting value. In each of the groups, the arranging order of the functional cells in the cell rank is determined considering a connecting relationship of the functional cells. Specifically, positional changes of the functional cells are performed as needed to minimize the number of wires between the functional cells.

However, in the foregoing first layout method, when the cell rank limiting value is exceeded upon grouping, it is possible that a functional cell which should be arranged in the present cell rank is arranged in another cell rank. This is caused by the fact that the functional cells are arranged only based on the cell length, that is, without considering a circuit structure. Further, due to the arranging order of the functional cells in one rank, more wiring may be needed, thereby increasing a size of a wiring region.

In the second layout method, each of the functional cells corresponding to each of the ranks is assigned parameters in the form of a group name representing the same group and relative position coordinates representing a relative position of the cell in the group. First, grouping of the functional cells is performed based on the group names, and then the functional cells are disposed per group depending on the relative position coordinates.

In the third layout method, a cell arranging table having relative positions of the functional cells is prepared. Then, with reference to the cell arranging table, the functional cells are arranged using instance names assigned thereto and defined by names representing relative positions of the cells to the groups.

However, in either of the second and third layout methods, since the arrangement of the functional cells is manually given in advance, much labor is required. Further, when arranging the functional cells using the instance names thereof, the arranging operation cannot but rely on the form of the instance names.

In the fourth layout method, as described in Japanese First (unexamined) Patent Publication No. 5-152439, the functional cells are arranged in a direction of propagation of the data signals, and the control signals and the data signals are delivered through the first layer metal wiring and the second layer metal wiring, respectively, so as to achieve the high-density layout.

However, in the fourth layout method, it is possible that the first layer metal wiring and the second layer metal wiring are not arranged linearly so that the size of the wiring region is increased.

SUMMARY OF THE INVENTION

Therefore, it is an object of the present invention to provide an improved semiconductor device layout method which is capable of arranging functional cells with data signal lines and control signal lines having a proper length and configuration.

A semiconductor device layout method to which the present invention is applicable is for arranging a given number of functional cells with regularity. The method comprises the steps of reading out a net list including circuit connection data necessary for arranging the functional cells, grouping the functional cells into groups based on the net list and either of common data signals and common control signals, determining an arranging order of the common data signals and the common control signals, rearranging the functional cells per group based on either of the common data signals and the common control signals, outputting a relative position list including relative positions of the rearranged functional cells, and the functional cells based on read-out size data of the functional cells and the relative position list.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

For facilitating understanding of later-described preferred embodiments of the present invention, the conventional semiconductor device layout methods will be first explained hereinbelow.

Figure 1:
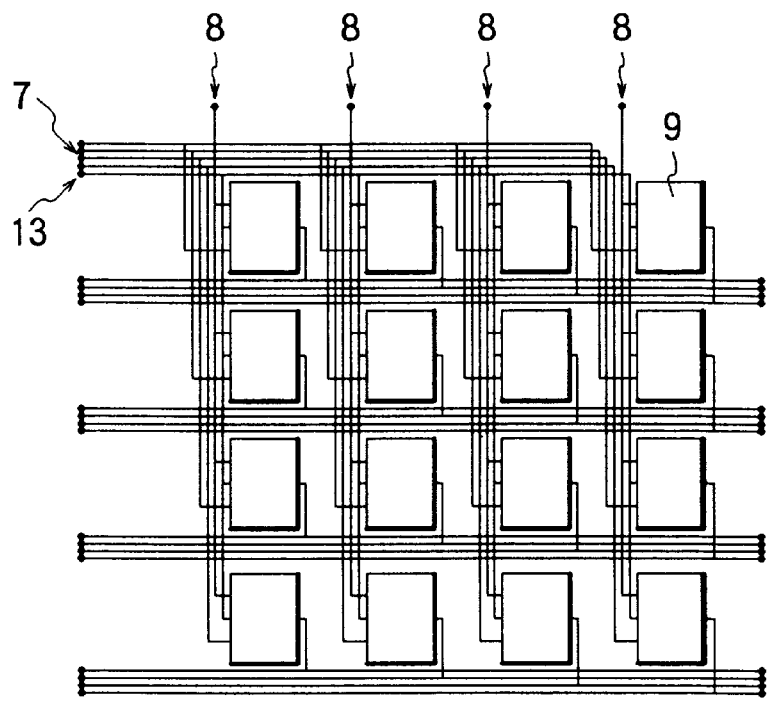
FIG. 1 is a diagram for explaining a general data path layout.
Figure 2:
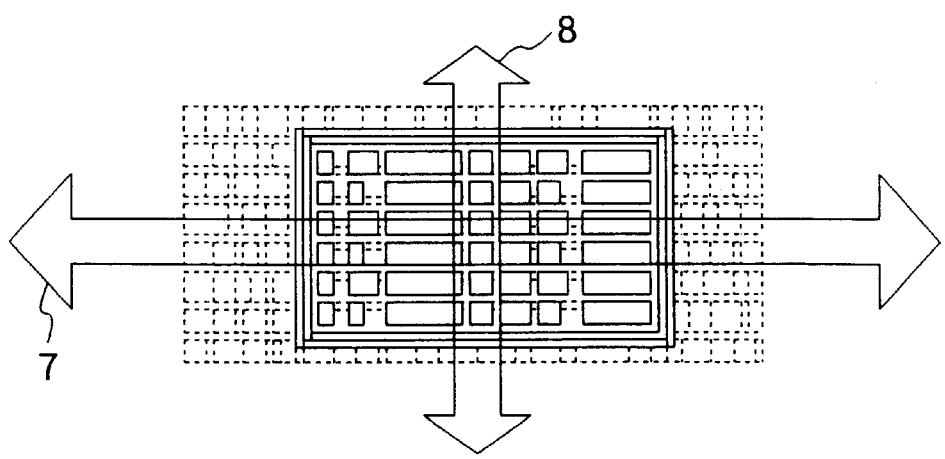
FIG. 2 is a diagram for explaining the flows of signals in the layout shown in FIG. 1.

As shown in FIG. 1, in the general data path layout for delivery and reception of data signals, a plurality of functional cells 9, each processing one-bit data, are connected to data signal lines 7 including a clock signal line 13 and control signal lines 8. The functional cells 9 are arranged with regularity corresponding to the number of bits to be processed. The flows of the signals are shown in FIG. 2, wherein the data signals 7 flow laterally while the control signals 8 flow vertically. As appreciated, the flow directions of the data signals and the control signals may be reversed.

Figure 3:
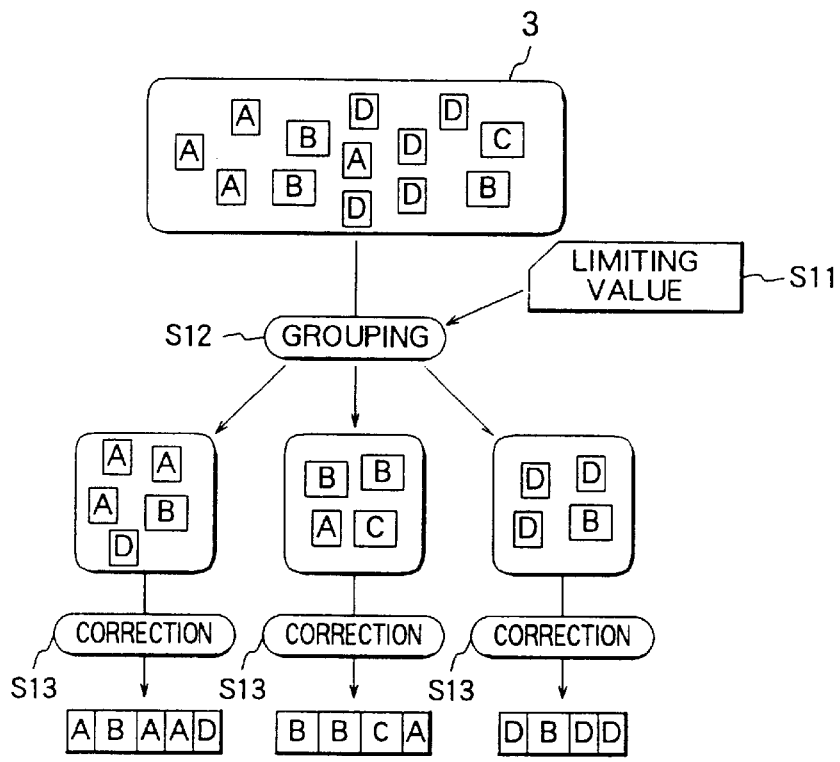
FIG. 3 is a flowchart for explaining a conventional first layout method.
Figure 4:
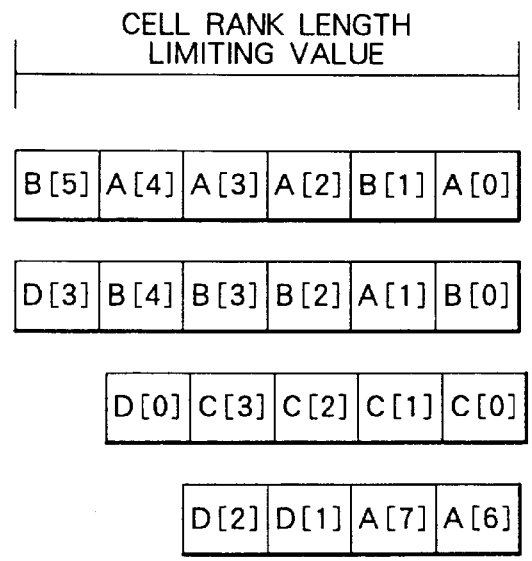
FIG. 4 is a diagram for explaining a cell rank length limiting value used in the conventional first layout method.

As described before, there have been available the following first to fourth layout methods for arranging the functional cells:

With reference to FIGS. 3 and 4, the first conventional layout method will be explained. Functional cells A, B, C and D in a cell library 3 are further distinguished using indices assigned thereto as seen from FIG. 4. At step S11, a cell rank length limiting value for limiting a cell rank length (sum of widths of functional cells included in one rank) is produced. Then, at step S12, the functional cells are grouped so as to be arranged within the cell rank length limiting value. Subsequently, at step S13, in each of the groups, the arranging order of the functional cells in the cell rank is determined considering a connecting relationship of the functional cells. Specifically, a cell rank correction is performed, wherein positional changes of the functional cells are performed as needed to minimize the number of wires between the functional cells.

Figure 5:
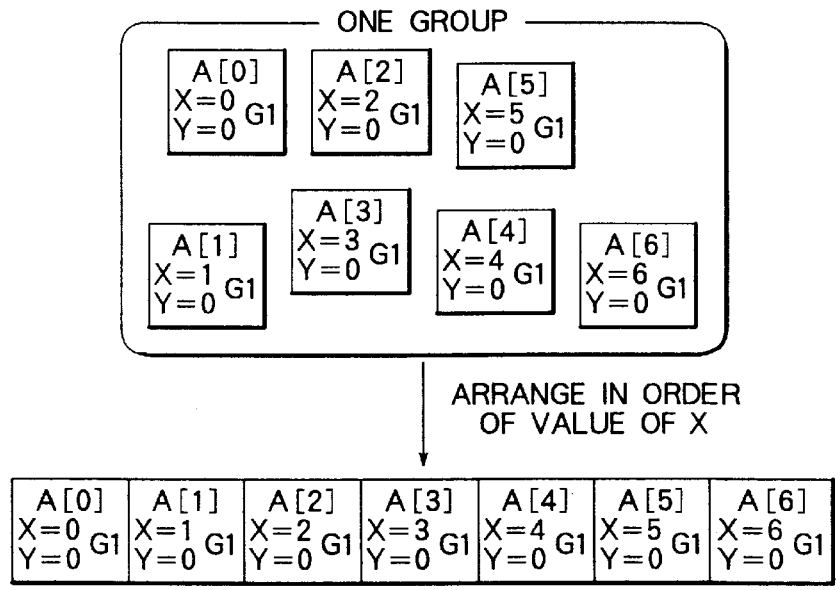
FIG. 5 is a diagram for explaining a conventional second layout method.

Now, referring to FIG. 5, the second conventional layout method will be explained. Each of the functional cells A[0] to A[6] belonging to the same group is assigned, in advance, two parameters in the form of a group name G1 to used for grouping and relative position coordinates (X, Y) representing a relative position of the cell in the group. The group, here, corresponds to one cell rank including a plurality of functional cells.

First, grouping of the functional cells is performed based on the assigned group names, and then the functional cells A[0] to A[6] are disposed per group depending on the arranging order determined by the relative position coordinates (X, Y).

Figure 6:
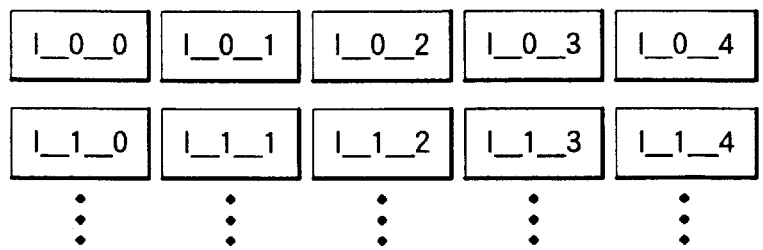
FIG. 6 is a diagram for explaining a conventional third layout method.

Now, referring to FIG. 6, the third conventional layout method will be explained. A cell arranging table assigning relative positions (X, Y) to each of the functional cells is prepared in advance, and the arrangement of the functional cells is performed according thereto. In this case, with reference to the cell arranging table, the functional cells are arranged using instance names assigned thereto and defined by names representing relative positions of the cells to the groups.

Figure 7:
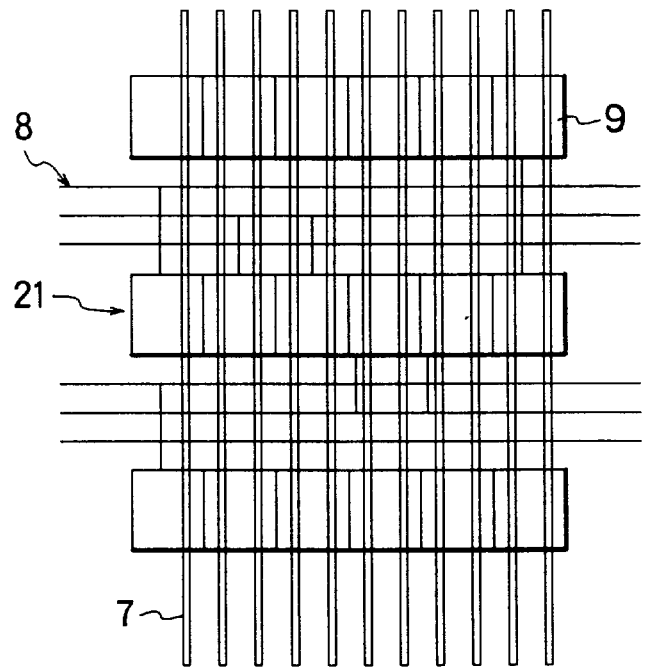
FIG. 7 is a diagram for explaining a conventional fourth layout method.

Now, referring to FIG. 7, the fourth conventional layout method will be explained. In this layout method, which is also described in Japanese First Unexamined Patent Publication No. 5-152439, the functional cells are arranged in a direction of propagation of the data signals, and the control signals and the data signals are delivered through the first layer metal wiring and the second layer metal wiring, respectively, so as to achieve the high-density layout. More specifically, a plurality of functional cells 9 are arranged in an X direction to form a functional cell block 21, and a plurality of functional cell blocks 21 are arranged in a Y direction, that is, a direction of propagation of the data signals. Between the adjacent functional cell blocks 21 are disposed a plurality of control signal lines 8 which extend in the X direction and made of first layer metal. Further, a plurality of data signal lines 7 for data delivery and reception between the functional cells 9 are made of second layer metal and extend in the Y direction passing through the corresponding functional cells 9.

Figure 8:
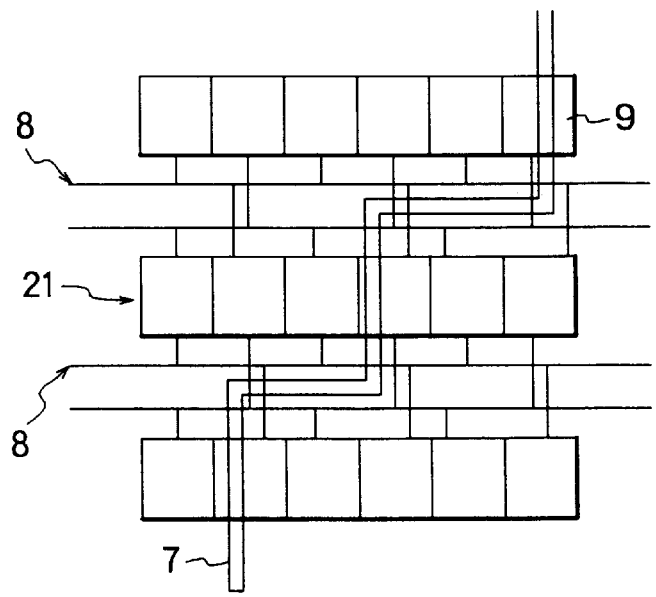
FIG. 8 is a diagram for explaining a problem caused by the conventional fourth layout method.

FIG. 8 shows a layout result according to the fourth layout method. The figure shows that, if the data signals do not flow through the functional cells of the same order between the functional cell blocks 21, bending is caused in the data signal lines 7 so as to lower the wiring efficiency.

Now, a semiconductor device layout method according to a first preferred embodiment of the present invention will be described hereinbelow with reference to FIG. 9. In this layout method, a given number of functional cells are arranged with regularity.

Figure 9:
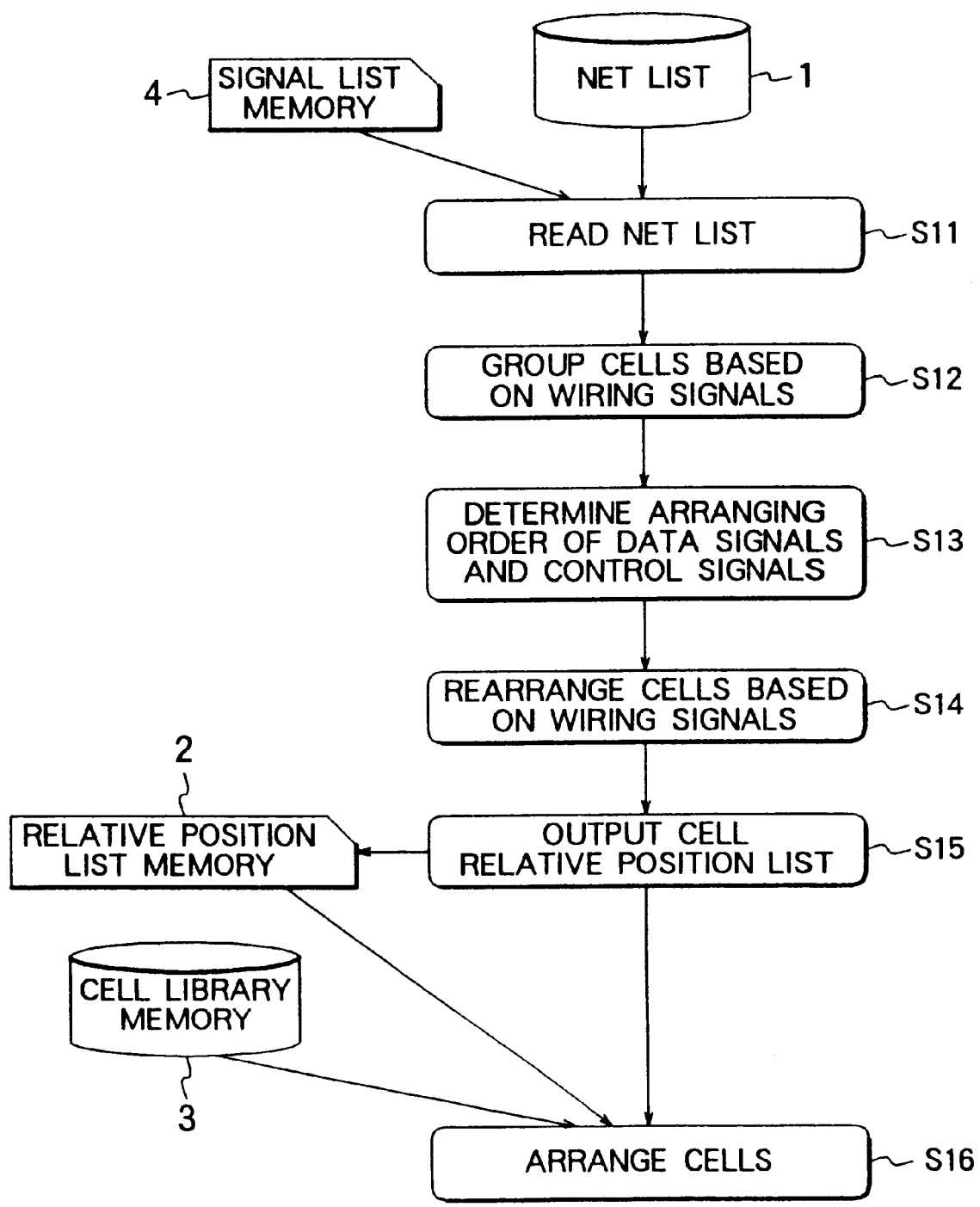
FIG. 9 is a flowchart for explaining a semiconductor device layout method according to a first preferred embodiment of the present invention.

In FIG. 9, a net list memory 1 stores a net list in the form of circuit connection data necessary for arranging the functional cells 9. The net list includes, for example, wiring data, such as circuit module names, module terminal names and types, cell names and types, connection wiring names and terminal arrangement. A relative position list memory 2 stores relative positions of the rearranged functional cells as a relative position list, as will be described later. A cell library memory 3 stores size data of the functional cells. A signal list memory 4 stores a list of data signal names and control signal names.

First at step S11, the net list is read out from the net list memory 1. Then, the data signal name and the control signal name are stored per functional cell, and a list of the data signal names and the control signal names is produced. It may be arranged that the data signal names and the control signal names are given from the signal list memory 4.

Figure 10:
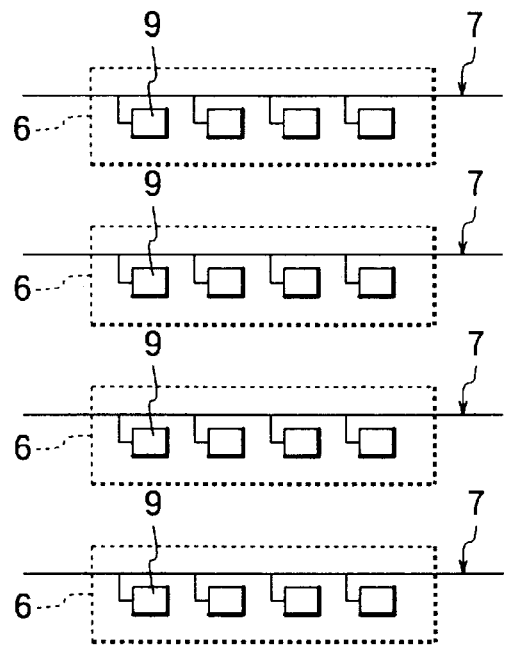
FIG. 10 is a diagram for explaining grouping of functional cells in the semiconductor device layout method according to the first preferred embodiment.

Then, at step S12, common data signals or common control signals are set to be wiring signals, and a given number of functional cells arranged based on the wiring signals and referring to the net list. Specifically, as shown in FIG. 10, for example, the functional cells 9 connected to one of the data signal lines 7 for the common data signal are put together into one of groups 6.

Subsequently, at step S13, the arranging order of the data signals and the control signals is determined. If the signal list is given, the order in the signal list is set to be the signal arranging order. On the other hand, if the signal list is not given, the order in the list of the data signal names and the control signal names is set to be the signal arranging order.

Then, at step S14, the functional cells are rearranged per group based on the common data signals or the common control signals, that is, wiring signals. Specifically, the arranging order of the functional cell in each group is determined, for example, based on a connecting relationship of a control signal and an arranging order of the control signal.

Then, at step S15, a relative position list of the rearranged functional cells is outputted. The relative position of each functional cell is determined based on the corresponding data and control signal names and the arranging order of the data and control signals determined at step S13, wherein the rank order is determined as the data signal order while the column order is determined as the control signal order. Specifically, the relative position list is determined by the connection order between the common data signals and the common control signals. The relative position list is stored in the relative position list memory 2.

Now, proceeding to step S16, the arrangement or placement of the functional cells is performed based on the size data of the cells read out from the cell library memory 3 and the relative position list read out from the relative position list memory 2. In this manner, the data path layout is determined. Specifically, based on the size data of the cells read out from the cell library memory 3 and the relative position list read out from the relative position list memory 2, the relative arrangement or placement including the size data of the functional cells is achieved.

Figure 11:
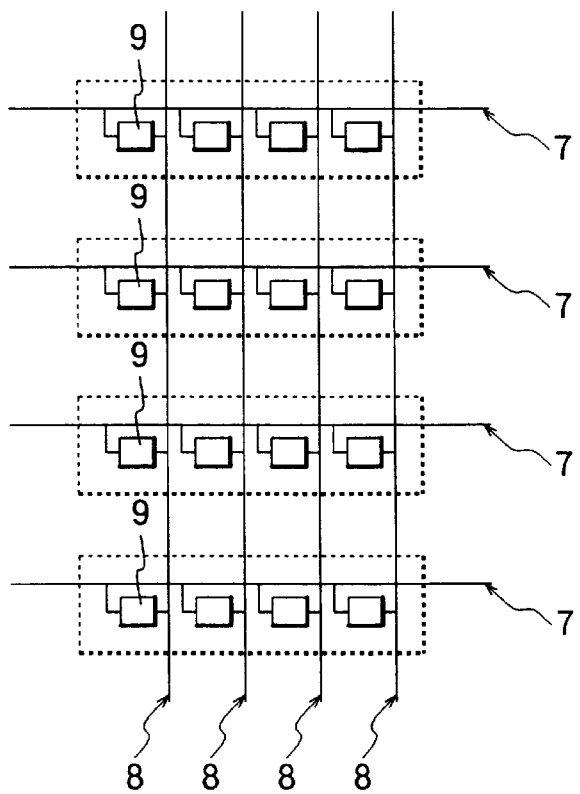
FIG. 11 is a diagram for explaining a data path layout achieved by the semiconductor device layout method according to the first preferred embodiment.

As a result, as shown in FIG. 11, the functional cells 9 connected to the same data signal lines 7 are arranged in the same ranks, while the functional cells 9 connected to the same control signal lines 8 are arranged in the same columns. With this arrangement, the data signal lines 7 and the control signal lines 8 are wired linearly. Accordingly, the high-speed data transmission can be achieved with the semiconductor device having the foregoing layout.

In the foregoing data path layout, the functional cells 9, each processing one-bit data, are arranged with regularity corresponding to the number of bits to be processed as shown in FIG. 1. Further, as shown in FIG. 2, the data signals (data signal lines 7) flow laterally while the control signals (control signal lines 8) flow vertically. As described before, the flow directions of the data signals and the control signals may be reversed.

Figure 12A:
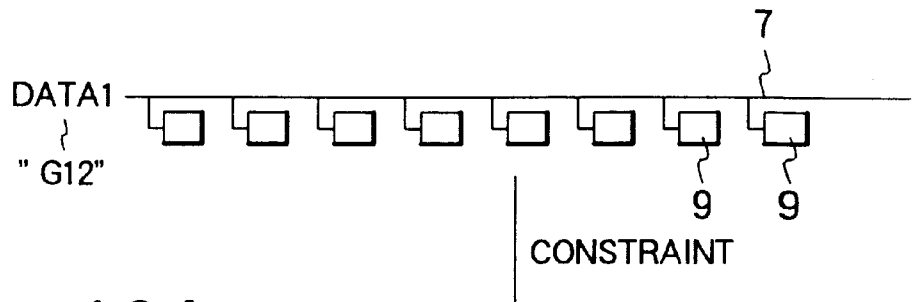
FIGS. 12A and 12B are diagrams for explaining a case where a logic synthesis is performed in the semiconductor device layout method as described with reference to FIG. 9.
Figure 12B:
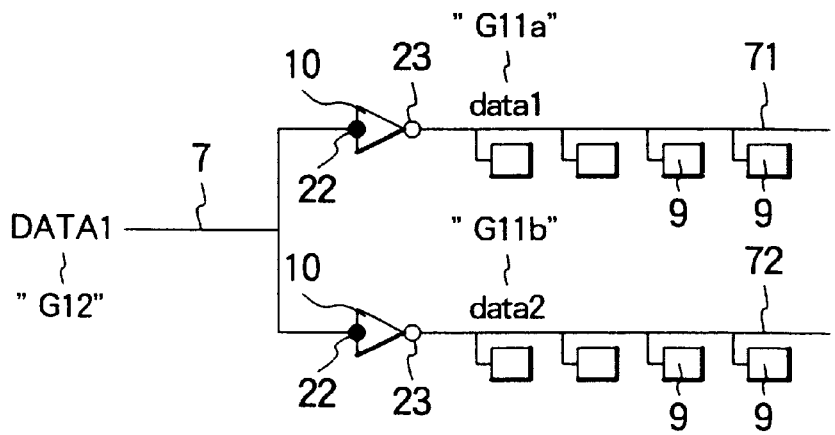
Figure 13:
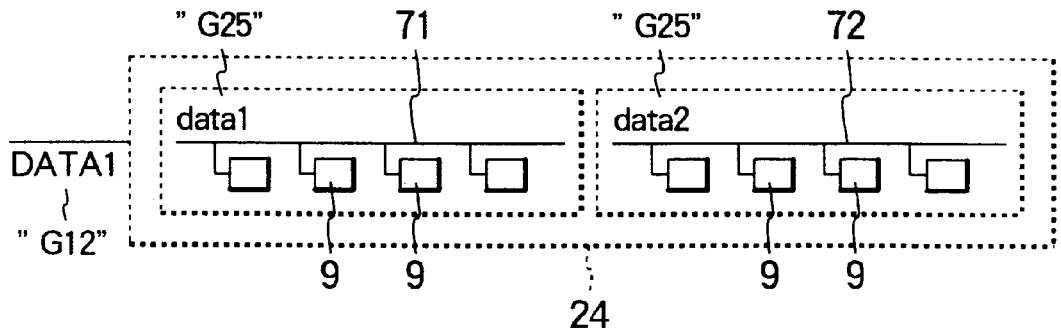
FIG. 13 is a diagram for explaining a particular process in a semiconductor device layout method according to a second preferred embodiment of the present invention.

As known in the art, when a particular condition, such as a timing constraint, is applied to a logic circuit so as to perform a logic synthesis, it is possible that a state, for example, as shown in FIGS. 12A and 12B, is caused. In FIG. 12A, a plurality of functional cells 9 connected to the data signal line 7 form a group having a group name "G12". On the other hand, in FIG. 12B, owing to provision of buffers 10 each having an input terminal 22 and an output terminal 23, the data signal line 7 is divided into two data signal lines 71 and 72, and a plurality of functional cells 9 connected to the data signal lines 71 and 72 form two groups having group names "G11a" and "G11b", respectively. In case of FIG. 12B, upon execution of steps S11 and S12 in FIG. 9, not only the functional cells 9 connected to the same data signal lines 7 are put together into the corresponding groups, but also, as shown in FIG. 13, the functional cells 9 connected to the data signal lines 71 and 72 are assigned a common group name "G25", respectively, and these groups ("G25") are unified to form one new unified group 24 which is assigned a group name "G12". In this case, each of the passing functional cells (buffers 10) which divide the data signal line 7 is recognized as one passing wiring node.

Upon execution of step S12 in FIG. 9, it is recognized whether a particular data signal common to the groups defined at step S12 in FIG. 9 is connected to a passing wiring node. If positive, that is, the particular common signal is connected to the passing wiring node, a group name of the corresponding group determined upon grouping of the functional cells is replaced with a data signal name of the passing wiring node. Then, those groups having group names, which are the same as the data signal name of the passing wiring node, are reformed into one group.

Figure 14:
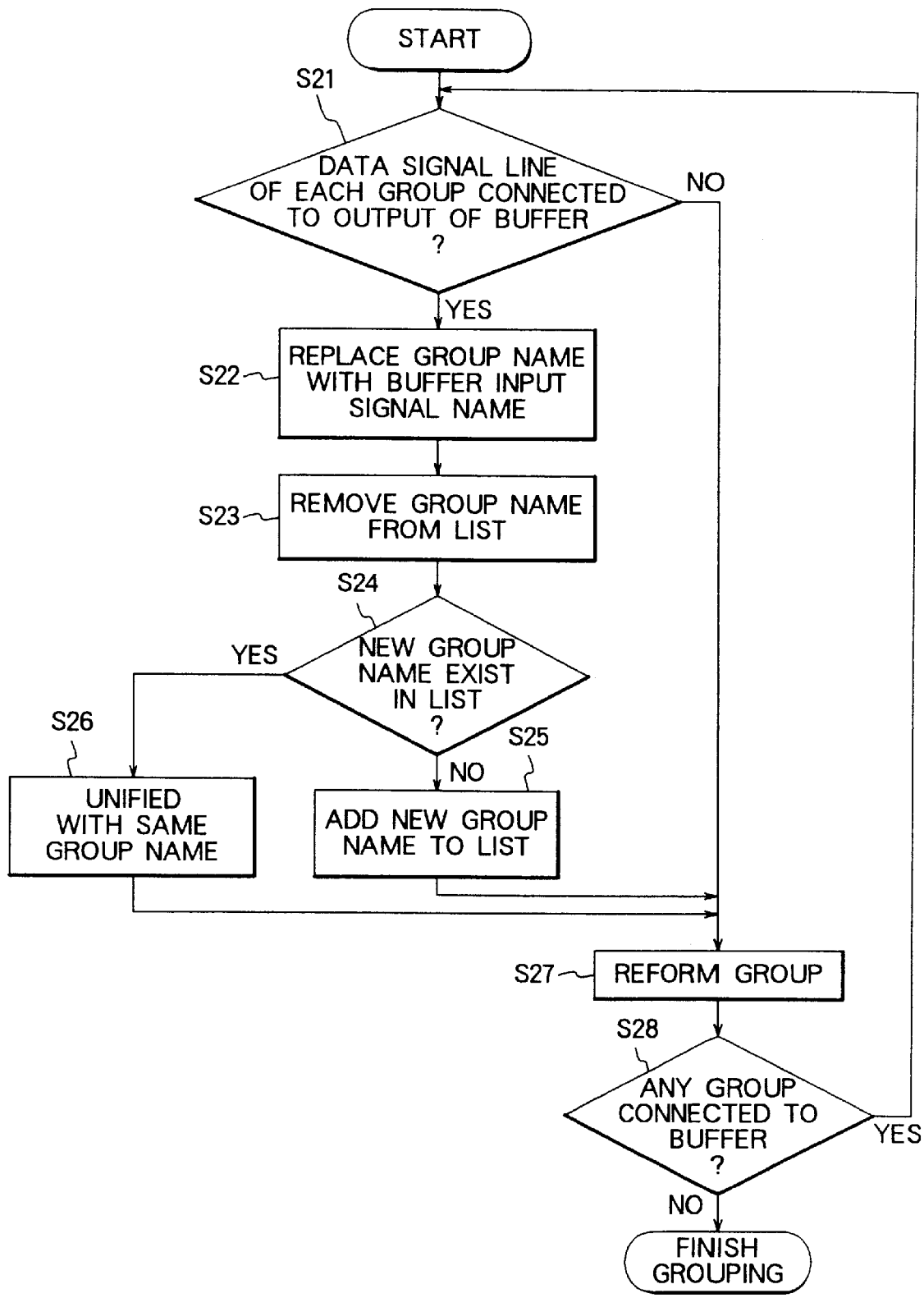
FIG. 14 is a flowchart for explaining a grouping process in the semiconductor device layout method according to the second preferred embodiment.

Now, referring to FIG. 14, further explanation will be given about grouping according to a second preferred embodiment of the present invention. First, step S21 determines whether any of the data signal lines of the groups defined at step S12 in FIG. 9 is connected to the output terminal 23 of the buffer 10, that is, whether the data signal line per group is connected to the output of the buffer 10. If connected, the process proceeds to step S22 where the buffer 10 is not handled as one functional cell, but as one passing wiring node, and the group name "G25" is replaced with the group name "G12" as an input signal name of the buffer 10. Then, at step S23, the replaced data signal (group name "G25") is removed from the list produced at step S11 in FIG. 9.

Subsequently, at step S24, it is determined whether the new group name "G12" exists in the list. If negative, the process proceeds to step S25 where the new group name "G12" is added to the list. On the other hand, if positive at step S24, the process proceeds to step S26 where those groups having the group name "G12" are unified. From step S21, S25 or S26, the process proceeds to step S27 where group reformation is performed.

Then, at step S28, it is determined whether there is any group connected to the buffer 10. If negative, grouping is finished. On the other hand, if positive at step S28, the process returns to step S21 to repeat execution of the foregoing steps until all the groups are connected to the functional cells other than the buffer 10.

Further explanation will be given hereinbelow about grouping. In FIG. 12B, the data signal lines 71 and 72 corresponding to the group names "G11a" and "G11b" are connected to the output terminals 23 of the buffers 10. Accordingly, the groups having the group names "G11a" and "G11b" are put together to form the group having the group name "G12" which is the name of the data signal line 7. Then, the group name "G25" is removed from the list, and the group name "G12" is added to the list. If there exist groups having the same group name, those groups are unified into one group. The foregoing processes are repeatedly performed. After grouping is finished, the process proceeds to step S13 in FIG. 9.

According to the foregoing semiconductor device layout methods, since the signal lines can be wired linearly with the same length, a standard deviation of a delay distribution per bit processing can be suppressed by ⅓ to ½ as compared with the prior art so that the speed-up of data transmission in the semiconductor device is highly achieved. Further, since the functional cells sharing the same data or control signal are put together into one group, the functional cells to be arranged in the same rank or column can be easily determined so that various kinds of semiconductor devices can be easily produced.

In the foregoing semiconductor device layout methods, the buffer cell is used as a functional cell for dividing the common data signal. However, instead of the buffer cell, such a functional cell may be used that provides the ratio of 1:1 with respect to the input and output signals thereof. Further, although the data signals are used for grouping, the control signal may be used therefor.

While the present invention has been described in terms of the preferred embodiments, the invention is not to be limited thereto, but can be embodied in various ways without departing from the principle of the invention as defined in the appended claims. The entire disclosure of Japanese Patent Application No. 8-47431 filed on Mar. 5, 1996 including specification, claims, drawings and summary are incorporated herein by reference in its entirety.

What is claimed is:

1. A semiconductor device layout method for arranging a given number of functional cells in ranks and columns, said method comprising the steps of:

reading out a net list including circuit connection data necessary for arranging said functional cells;

grouping said functional cells into groups based on said net list and either of common data signals and common control signals;

determining an arranging order of said common data signals and said common control signals;

rearranging said functional cells per group based on either of said common data signals and said common control signals so that those of said cells that are connected to the same one of said common data signals are arranged in the same ranks and so that those of said cells that are connected to the same one of said common control signals are arranged in the same columns;

outputting a relative position list including relative positions of said rearranged functional cells; and arranging said functional cells based on read-out size data of said functional cells and said relative position list.

2. The semiconductor device layout method according to claim 1, wherein said grouping step recognizes, as a passing wiring node, a passing functional cell which divides either of said common data signals and said common control signals.

3. The semiconductor device layout method according to claim 2, wherein said grouping step further comprises the steps of:

recognizing whether either of a particular data signal and a particular control signal common to said groups is connected to the passing wiring node;

replacing if said connection recognizing step recognizes that said particular signal is connected to the passing wiring node, a group name of the corresponding group determined upon grouping of said functional cells, with either of a data signal name and a control signal name of said passing wiring node; and reforming those groups having group names, which are the same as said either of the data signal name and the control signal name, into one group.

4. The semiconductor device layout method according to claim 1, wherein said relative position list is determined based on a connection order between said common data signals and said common control signals.

5. A semiconductor device arranged according to the semiconductor device layout method of claim 1, wherein data signal lines for said common data signals and control signal lines for said common control signals are wired linearly.

6. A semiconductor device layout method for arranging a given number of functional cells with regularity, said method comprising the steps of:

reading out a net list including circuit connection data necessary for arranging said functional cells;

grouping said functional cells into groups based on said net list and either of common data signals and common control signals, and recognizing, as a passing wiring node, a passing functional cell which divides either of said common data signals and said common control signals;

determining an arranging order of said common data signals and said common control signals;

rearranging said functional cells per group based on either of said common data signals and said common control signals;

outputting a relative position list including relative positions of said rearranged functional cells;

arranging said functional cells based on read-out size data of said functional cells and said relative position list;

recognizing whether either of a particular data signal and a particular control signal common to said groups is connected to the passing wiring node;

replacing, if said connection recognizing step recognizes that said particular signal is connected to the passing wiring node, a group name of the corresponding group determined upon grouping of said functional cells, with either of a data signal name and a control signal name of said passing wiring node; and reforming those groups having group names, which are the same as said either of the data signal name and the control signal name, into one group.

* * * * *